United States Patent
Teiche

(10) Patent No.: US 10,331,830 B1
(45) Date of Patent: Jun. 25, 2019

(54) HETEROGENEOUS LOGIC GATE SIMULATION USING SIMD INSTRUCTIONS

(71) Applicant: Apple Inc., Cupertino, CA (US)

(72) Inventor: Alex S. Teiche, Bainbridge Island, WA (US)

(73) Assignee: Apple Inc., Cupertino, CA (US)

( * ) Notice: Subject to any disclaimer, the term of this patent is extended or adjusted under 35 U.S.C. 154(b) by 62 days.

(21) Appl. No.: 15/181,038

(22) Filed: Jun. 13, 2016

(51) Int. Cl.
*G06F 17/50* (2006.01)
*G06F 15/80* (2006.01)

(52) U.S. Cl.
CPC ...... *G06F 17/5036* (2013.01); *G06F 15/8007* (2013.01); *G06F 17/5022* (2013.01)

(58) Field of Classification Search
CPC ............. G06F 17/5086; G06F 17/8007; G06F 17/5022
See application file for complete search history.

(56) References Cited

U.S. PATENT DOCUMENTS

| | | | |
|---|---|---|---|
| 8,738,349 B2 | 5/2014 | Bertacco et al. | |
| 9,031,825 B1 | 5/2015 | McGaughy | |
| 2004/0054877 A1* | 3/2004 | Macy, Jr. | G06F 7/76 712/221 |
| 2011/0072403 A1* | 3/2011 | Basile | G06F 17/5022 716/106 |
| 2013/0226535 A1 | 8/2013 | Tuan | |

OTHER PUBLICATIONS

Natsuki Kai, et al., "A SIMD Parallelization Method for an Application for LSI Logic Simulation," 41st International Conference on Parallel Processing Workshops, 2012, pp. 375-381.

* cited by examiner

*Primary Examiner* — Vuthe Siek
(74) *Attorney, Agent, or Firm* — Anthony M. Petro; Meyertons, Hood, Kivlin, Kowert & Goetzel, P.C.

(57) ABSTRACT

Techniques for logic gate simulation. Program instructions may be executable by a processor to select logic gates from a netlist that specifies a gate-level representation of a digital circuit. Each logic gate may be assigned to a corresponding element position of a single-instruction, multiple-data (SIMD) shuffle or population count instruction, and at least two logic gates may specify different logic functions. Simulation-executable instructions including the SIMD shuffle or population count instruction may be generated. When executed, the simulation-executable instructions simulate the functionality of the selected logic gates. More particularly, execution of the SIMD shuffle or population count instruction may concurrently simulate operation of at least two logic gates that specify different logic functions.

20 Claims, 15 Drawing Sheets

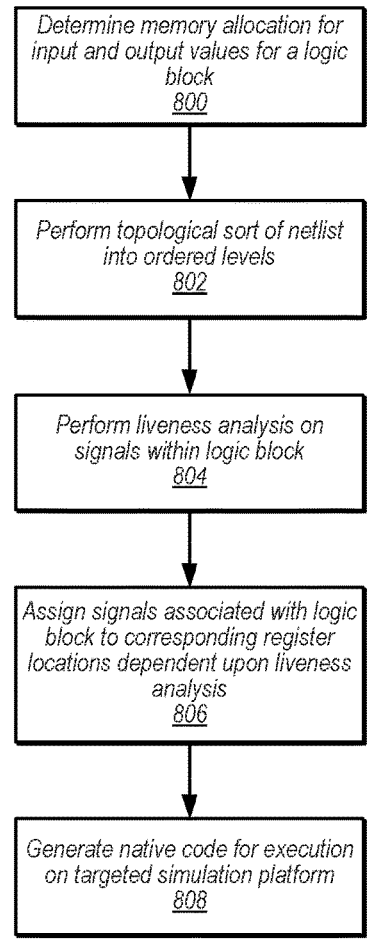

FIG. 8

```
reg_byte_stack = [reg4[0], reg4[1], reg4[2], ..., reg15[15]]
FOR EACH LEVEL L FROM INPUTS TO OUTPUTS
    FOR EACH UNASSIGNED SIGNAL S
        IF S.start_level == L
            WHILE REG_BYTE_USED_IN_RANGE(S.start_level, S.end_level,
                reg_byte_stack.top())
// If the register byte has been pre-assigned, respect that assignment
// by skipping it. The register will be placed back on the stack once
// the signal it was pre-allocated to is no longer live
                reg_byte_stack.pop()

S.register_byte = reg_byte_stack.pop()
            IF S.end_level == L
                reg_byte_stack.push(S.register_byte)
```

FIG. 9

```
// Initialize 2-state simulation
//
// Define 16-byte lookup table for 2-state logic in
// two halves, and store in reg0

UpperTwoStateLogicLUT = 0x0000000000000000
LowerTwoStateLogicLUT = 0x0001000101000001 move {UpperTwoStateLogicLUT, LowerTwoStateLogicLUT}, reg0

// Load 16-byte window containing netlist inputs into reg2
//
// Note that here, outputs Q0 and Q1 are contained in window
// along with inputs A-E, but will be ignored
//
// After load, reg2 contains {Q1, Q0, E, D, C, B, A}
// (from MSB to LSB and zero-extended to 16 bytes)

move (input_ptr), reg2

// Use shuffle instruction to remap input values into reg4
// according to register mapping defined by liveness analysis
//
// Define 16-byte shuffle mask in two halves based on
// liveness analysis (see Table 8), and store in reg1

UpperGatherMask_Liveness = 0xFFFFFFFFFFFFFFFF
LowerGatherMask_Liveness = 0xFFFF0001020403FF move {UpperGatherMask_Liveness, LowerGatherMask_Liveness}, reg1

// Using the register allocations defined in the map stored
// in reg1, use the shuffle instruction to remap the input values
// stored in reg2 to the locations of reg4 defined by the map.
//
// Note that it is assumed that a mask value of 0xFF will cause
// a corresponding output position to be zeroed.  This may be
// accomplished in any suitable fashion depending on the
// particular architecture employed.

// In this example,
// reg4[0] gets 0, because it is assigned to Q0, which is not an input
// reg4[1] gets the D input as per Table 3, from reg2[3]
// reg4[2] gets the E input, from reg2[4]
// reg4[3] gets the C input, from reg2[2]
// reg4[4] gets the B input, from reg2[1]
// reg4[5] gets the A input, from reg2[0]
// All other reg4 bytes get 0 shuffle reg1, reg2, reg4
```

*FIG. 10A*

```
// ================================================
// =                    Level 2                   =
// ================================================
//
// The A operands of Level 2 gates are gathered into
// corresponding positions of reg1 using a shuffle
// operation with a mask in reg3 that pulls those
// operands out of reg4.

UpperGatherMask_Level2A = 0xFFFFFFFFFFFFFFFF
LowerGatherMask_Level2A = 0xFFFFFFFFFFFF0503 move {UpperGatherMask_Level2A, LowerGatherMask_Level2A}, reg3

// Using this mask,
// reg1[0] gets reg4[3](input C)
// reg1[1] gets reg4[5](input A)
// all other reg1 bytes get 0 shuffle reg3, reg4, reg1
// At this point, reg1[15:0] = {0 . . . A, C}

// The B operands of Level 2 gates are gathered into
// reg2 in a similar fashion.

UpperGatherMask_Level2B = 0xFFFFFFFFFFFFFFFF
LowerGatherMask_Level2B = 0xFFFFFFFFFFFF0401 move {UpperGatherMask_Level2B, LowerGatherMask_Level2B}, reg3

// Using this mask,
// reg2[0] gets reg4[1](input D)
// reg2[1] gets reg4[4](input B)
// all other reg2 bytes get 0x00 shuffle reg3, reg4, reg2
// At this point, reg2[15:0] = {0, . . . B, D}

// Sum the A and B inputs using a SIMD add simd_add reg2, reg1, reg1

// Define a mask that specifies the type of
// Boolean operation to be performed by each
// gate, according to encoding shown in Table 5.
// Here, position 0 performs OR (mask = 2), and
// position 1 performs AND (mask = 1).

UpperGateMask_Level2 = 0x0000000000000000
LowerGateMask_Level2 = 0x0000000000000102 move {UpperGateMask_Level2, LowerGateMask_Level2}, reg2
```

FIG. 10B

```
// Add gate type mask to sum of operands, and
// then perform a shuffle on the result using the
// lookup table previously stored in reg0.

simd_add reg2, reg1, reg1
shuffle reg1, reg0, reg1
// At this point, reg1[15:0] = {0, . . . Q0, P}

// Scatter results back to intermediate registers.
// Per the register allocation in Table 8,
// P gets stored in reg4[6]
// Q0 gets stored in reg4[0]
// That is, we must perform the following location moves:
// reg1[0] -> reg4[6]
// reg1[1] -> reg4[0]

// First, zero reg4[0] and reg4[6] by ANDing with 0x00

UpperDestMask_Level2 = 0xFFFFFFFFFFFFFFFF
LowerDestMask_Level2 = 0xFF00FFFFFFFFFF00 move {UpperDestMask_Level2, LowerDestMask_Level2}, reg2
simd_and reg2, reg4, reg4

// Now, use a shuffle instruction to map the results in reg1
// to the location they will ultimately occupy (reg1[0] goes to
// position 6 and reg1[1] goes to position 0), store
// this result temporarily in reg2, and then add reg2 and
// reg4 to effectively complete the move into reg4.
// Other positions of reg2 are zeroed.

UpperScatterMask_Level2 = 0xFFFFFFFFFFFFFFFF
LowerScatterMask_Level2 = 0xFF00FFFFFFFFFF01 move {UpperScatterMask_Level2, LowerScatterMask_Level2}, reg3
shuffle reg3, reg1, reg2
// At this point, reg2[15:0] = {0, . . . 0, P, 0, 0, 0, 0, 0,
Q0} simd_add reg2, reg4, reg4
// At this point, reg4[15:0] = {0, . . . 0, P, 0, B, C, E, D,
Q0}
// Note that A got overwritten by P, because the liveness
analysis
// indicated that A is not needed after level 2.

// Simulation of Level 2 COMPLETE.
```

*FIG. 10C*

```
// ========================================================
// =                      Level 1                         =
// ========================================================
//
// Note that simulation of Levels 1 and 0 proceeds in
// substantially the same fashion as for Level 2 above.
// Differences are largely reflected in the masks that
// gather operands, specify Boolean operation types,
// and scatter results back to intermediate registers.

// Gather A operands of Level 1 gates into reg1 using
// mask in reg3 that pulls operands out of reg4.

UpperGatherMask_Level1A = 0xFFFFFFFFFFFFFFFF
LowerGatherMask_Level1A = 0xFFFFFFFFFFFFFF00 move {UpperGatherMask_Level1A, LowerGatherMask_Level1A}, reg3 shuffle reg3, reg4, reg1
// At this point, reg1[15:0] = {0, . . . Q0}

// Gather B operands of Level 1 gates into reg2.

UpperGatherMask_Level1B = 0xFFFFFFFFFFFFFFFF
LowerGatherMask_Level1B = 0xFFFFFFFFFFFFFF06 move {UpperGatherMask_Level1B, LowerGatherMask_Level1B}, reg3 shuffle reg3, reg4, reg2
// At this point, reg2[15:0] = {0, . . . P}

// Sum A and B inputs using SIMD add simd_add reg2, reg1, reg1

// Define gate operation mask for Level 1

UpperGateMask_Level1 = 0x0000000000000000
LowerGateMask_Level1 = 0x0000000000000003 move {UpperGateMask_Level1, LowerGateMask_Level1}, reg2

// Add gate type mask to sum of operands, and then
// perform shuffle on the result using the lookup table
// in reg0 to simulate Level 1.

simd_add reg2, reg1, reg1
shuffle reg1, reg0, reg1
// At this point, reg1[15:0] = {0, . . . R}

// Scatter results back to reg4.

UpperDestMask_Level1 = 0xFFFFFFFFFFFFFFFF
LowerDestMask_Level1 = 0xFFFF00FFFFFFFFFF
```

FIG. 10D

```
// Scatter results back to reg4.

UpperDestMask_Level1 = 0xFFFFFFFFFFFFFFFF
LowerDestMask_Level1 = 0xFFFF00FFFFFFFFFF move {UpperDestMask_Level1, LowerDestMask_Level1}, reg2
simd_and reg2, reg4, reg4

UpperScatterMask_Level1 = 0xFFFFFFFFFFFFFFFF
LowerScatterMask_Level1 = 0xFFFF00FFFFFFFFFF move {UpperScatterMask_Level1, LowerScatterMask_Level1}, reg3
shuffle reg3, reg1, reg2
simd_add reg2, reg4, reg4
// At this point, reg4[15:0] = {0, . . . 0, P, R, B, C, E, D, Q0}

// Simulation of Level 1 COMPLETE.

// ================================================
// =                    Level 0                   =
// ================================================

// Gather A operands of Level 0 gates into reg1 using
// mask in reg3 that pulls operands out of reg4.

UpperGatherMask_Level0A = 0xFFFFFFFFFFFFFFFF
LowerGatherMask_Level0A = 0xFFFFFFFFFFFFFF05 move {UpperGatherMask_Level0A, LowerGatherMask_Level0A}, reg3 shuffle reg3, reg4, reg1
// At this point, reg1[15:0] = {0, . . . R}

// Gather B operands of Level 0 gates into reg2.

UpperGatherMask_Level0B = 0xFFFFFFFFFFFFFFFF
LowerGatherMask_Level0B = 0xFFFFFFFFFFFFFF02 move {UpperGatherMask_Level0B, LowerGatherMask_Level0B}, reg3 shuffle reg3, reg4, reg2
// At this point, reg2[15:0] = {0, . . . E}

// Sum A and B inputs using SIMD add simd_add reg2, reg1, reg1
```

FIG. 10E

```
// Define gate operation mask for Level 0

UpperGateMask_Level0 = 0x0000000000000000
LowerGateMask_Level0 = 0x0000000000000005 move {UpperGateMask_Level0, LowerGateMask_Level0}, reg2

// Add gate type mask to sum of operands, and then
// perform shuffle on the result using the lookup table
// in reg0 to simulate Level 0.

simd_add reg2, reg1, reg1
shuffle reg1, reg0, reg1
// At this point, reg1[15:0] = {0, . . . Q1}

// Scatter results back to reg4.

UpperDestMask_Level0 = 0xFFFFFFFFFFFFFFFF
LowerDestMask_Level0 = 0xFFFFFFFFFFFF00FF move {UpperDestMask_Level0, LowerDestMask_Level0}, reg2
simd_and reg2, reg4, reg4

UpperScatterMask_Level0 = 0xFFFFFFFFFFFFFFFF
LowerScatterMask_Level0 = 0xFFFFFFFFFFFF00FF move {UpperScatterMask_Level0, LowerScatterMask_Level0}, reg3
shuffle reg3, reg1, reg2
simd_add reg2, reg4, reg4
// At this point, reg4[15:0] = {0, . . . 0, P, R, B, C, E, Q1, Q0}

// Simulation of Level 0 COMPLETE.

// Store results to memory.

move reg4, (output_ptr)
```

*FIG. 10F*

HETEROGENEOUS LOGIC GATE SIMULATION USING SIMD INSTRUCTIONS

BACKGROUND

Technical Field

Embodiments described herein relate to the field of processor hardware design and more particularly, to techniques for simulating a logic gate model of a digital circuit.

Description of the Related Art

Design of digital circuits, such as microprocessors, graphics processors, embedded processors, or other complex digital circuits, typically involves modeling the behavior of the design at various levels of abstraction and testing those models extensively to verify that the model correctly implements the design. For example, during early design stages, a hardware description language (HDL) such as Verilog™ or VHDL™ may be employed to model a processor's behavior at a high level of abstraction in which the behavior of various digital components is modeled without attempting to account for the structure or physical arrangement of the devices that will ultimately be used to realize those components. Thus, for example, a behavioral representation of an adder circuit in an HDL may simply employ a functional addition operator (e.g., sum=a+b) without representing the circuit structure of the adder itself.

Because of their relative compactness, behavioral circuit models may be relatively easily developed and simulated. Ultimately, however, a design generally needs to be expressed in terms of the physical devices that will be manufactured. For example, one common structural representation of a digital circuit is referred to as a gate-level model. Generally speaking, a gate-level model expresses a set of logic gates and their interconnection, where each logic gate outputs a particular Boolean logic function of its inputs (e.g., AND, OR, NOT, NAND, NOR, etc.). Each logic gate may be capable of being realized as a set of manufacturable devices (e.g., N-type and P-type field effect transistors (FETs)). Thus, a gate-level model of a digital circuit may more closely represent the actual physical structure of the circuit as manufactured than a model at a higher level of abstraction.

Because a gate-level model may contain substantially more information than a more abstract model, however, the gate-level model may present a considerably greater computational burden to simulate. As the complexity of digital circuit design escalates, the burden of simulating gate-level design models increases, adding time, resource costs, or both to the design effort.

SUMMARY

Systems, apparatuses, and methods for performing heterogeneous gate-level simulation using single-instruction, multiple-data (SIMD) instructions are contemplated.

In various embodiments, a computer-accessible storage medium may store program instructions that are executable by one or more processors to select logic gates from a netlist that specifies a gate-level representation of a digital circuit, and assign each logic gate to a corresponding element position of a SIMD instruction, where at least two of the logic gates specify different logic functions, and where the SIMD instruction includes a byte shuffle instruction or a population count instruction. The instructions may further be executable to generate simulation-executable instructions including the SIMD instruction. When executed, the simulation-executable instructions may simulate the functionality of the logic gates, and execution of the SIMD instruction may concurrently simulate the behavior at the at least two logic gates that specify different logic functions. In some embodiments, shuffle instructions that operate on elements larger or smaller than a byte may be employed.

A system including one or more processors and a memory that stores program instructions is also contemplated. The program instructions may be executable by the one or more processors to store first input values within corresponding SIMD element positions of a first SIMD register. Each of the SIMD element positions may correspond to a respective logic gate of a set of logic gates representative of a digital circuit, and for each given SIMD element position, the first input value at the given SIMD element position corresponds to a first input of the respective logic gate corresponding to the given SIMD element position. At least two of the set of logic gates may specify different logic functions. The program instructions may further be executable to store second input values within corresponding SIMD element positions of a second SIMD register, where for each given SIMD element position, the second input value at the given SIMD element position corresponds to a second input of the respective logic gate corresponding to the given SIMD element position. The program instructions may further be executable to generate, using a single SIMD instruction that is dependent upon the first and second SIMD registers, simulation results indicative of the functionality of the logic gates. Execution of the single SIMD instruction may concurrently simulate the behavior of the at least two logic gates that specify different functions.

A method is further contemplated that includes generating, by one or more processors, a set of values indicative of inputs to a set of logic gates representative of a digital circuit, and executing, by the one or more processors, a single-instruction multiple-data (SIMD) instruction dependent upon the set of values to concurrently simulate the functionality of the logic gates. At least two of the logic gates may specify different logic functions that are concurrently simulated by executing the SIMD instruction.

BRIEF DESCRIPTION OF THE DRAWINGS

The above and further advantages of the methods and mechanisms may be better understood by referring to the following description in conjunction with the accompanying drawings, in which:

FIG. 8 is a flow diagram illustrating examples of operations that may be employed in the compilation of an example netlist.

FIG. 9 illustrates example pseudocode for a stack-based register allocation algorithm.

FIGS. 10A-F illustrate example pseudocode that may be generated to simulate an example circuit.

DETAILED DESCRIPTION OF EMBODIMENTS

Figure 1:
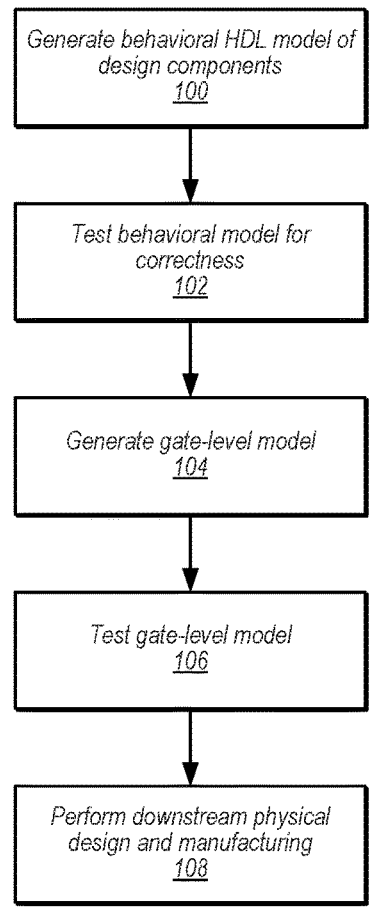
FIG. 1 is a flow diagram illustrating an example digital circuit design flow.

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described here. It will be appreciated that for simplicity and clarity of illustration, elements shown in the figures have not necessarily been drawn to scale. For example, the dimensions of some of the elements may be exaggerated relative to other elements.

This specification includes references to "an embodiment." The appearance of the phrase "in an embodiment" in different contexts does not necessarily refer to the same embodiment. Particular features, structures, or characteristics may be combined in any suitable manner consistent with this disclosure. Furthermore, as used throughout this application, the word "may" is used in a permissive sense (i.e., meaning "having the potential to"), rather than the mandatory sense (i.e., meaning "must"). Similarly, the words "include," "including," and "includes" mean including, but not limited to.

Terminology

The following paragraphs provide definitions and/or context for terms found in this disclosure (including the appended claims):

"Comprising." This term is open-ended. As used in the appended claims, this term does not foreclose additional structure or steps. Consider a claim that recites: "A system comprising a processor . . . ." Such a claim does not foreclose the system from including additional components (e.g., a display, a memory controller).

"Configured To." Various units, circuits, or other components may be described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f) for that unit/circuit/component. Additionally, "configured to" can include generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B. "Dependent on" may be employed as a synonym for "based on."

"In Response To." As used herein, this term is used to describe causality of events or conditions. For example, in the phrase "B occurs in response to A," there is a cause-and-effect relationship in which A causes B to occur. It is noted that this phrase does not entail that A is the only event that causes B to occur; B may also occur in response to other events or conditions that may be independent of or dependent on A. Moreover, this phrase does not foreclose the possibility that other events or conditions may also be required to cause B to occur. For example, in some instances, A alone may be sufficient to cause B to happen, whereas in other instances, A may be a necessary condition, but not a sufficient one (such as in the case that "B occurs in response to A and C").

"Each." With respect to a plurality or set of elements, the term "each" may be used to ascribe some characteristic to all the members of that plurality or set. But absent language to the contrary, use of "each" does not foreclose the possibility that other instances of the element might not include the characteristic. For example, in the phrase "a plurality of widgets, each of which exhibits property A," there must be at least two (and possibly arbitrarily many) widgets that exhibit property A. But without more, this does not foreclose the possibility of an additional widget, not a member of the plurality, that does not exhibit property A. In other words, absent language to the contrary, the term "each" does not refer to every possible instance of an element, but rather every element in a particular plurality or set.

Introduction

Turning now to FIG. 1, a flow diagram is shown that illustrates an example digital circuit design flow at a high level of generality. Preliminarily, it is noted that the illustrated flow is not intended to be universal or comprehensive, but instead to illustrate selected elements of the design flow for the purposes of illuminating subsequent discussion of netlist simulation techniques. Numerous aspects of the design process (e.g., physical design, timing closure) have been omitted for clarity.

At block 100, a behavioral HDL representation or "model" of design components is generated. For example, in a processor design, architects may divide the processor into high-level units, such as an instruction cache, instruction issue logic, execution units (e.g., integer, floating point, etc.), level 1 data cache, level 2 cache, and so forth. The high-level units may be further subdivided into subunits in a hierarchical fashion in order to reduce the complexity of the overall design to a tractable set of modules. Individual HDL modules may model the behavior of control and dataflow elements of the overall processor design.

The behavioral model is then tested for correctness (block 102). For example, individual modules or collections of modules may be tested using testbenches that are designed to apply test stimulus to the inputs of the module(s) and evaluate the outputs against expected results. The entire design may also be simulated, for example, by simulating the execution of actual sequences of instructions as they would be executed by the processor itself. The test process may be iterative; errors found during testing of the behavioral model may result in changes to the model code, which may in turn be retested to verify that the errors have been corrected and no new errors have been introduced.

A gate-level model is then generated (block 104). For a given module of the design, the gate-level model (which may also be referred to as a "netlist") generally specifies a set of logic gates (which may include state elements, such as latches, flip-flops, or the like) and their interconnection. The gate-level model may be generated through logic synthesis, in which a synthesis engine typically maps behavioral HDL onto a set of logic gates defined in a synthesis library. Not all modules in a given design may be synthesized, however. In some embodiments, for custom-designed circuits (e.g., memory arrays, custom datapath elements, etc.), the gate-level model may be extracted from design schematics rather than synthesis.

The gate-level model is then tested (block 106). For example, it cannot necessarily be assumed that netlists generated through synthesis or schematic capture are error free. Although in some circumstances, formal verification techniques may be able to prove the equivalence of a netlist of a module and its corresponding behavioral code, generally speaking, at least some level of gate-level simulation is typically required in most designs. The test stimuli and techniques may or may not be similar to those performed with respect to behavioral code. Like behavioral testing, the gate-level test process may also be iterative, as errors are found and corrected (or as gate-level changes dictated by timing closure or other physical design issues are made).

Once the gate-level model is determined to be sufficiently robust, downstream physical design processes and manufacturing may occur, ultimately leading to the realization of the design (block 108).

As noted previously, gate-level simulation may be computationally burdensome. The netlist for a complex processor design may include on the order of tens or hundreds of millions of gates, each of which needs to be computed independently of the others, and each of which needs to be continually recomputed in order to simulate a time sequence of operations of the modeled design.

One approach to accelerating gate-level simulation is to evaluate multiple logic gates concurrently. For example, many microprocessors provide single-instruction, multiple-data (SIMD) instructions that are capable of concurrently performing the same instruction on multiple sets of input operands. More specifically, SIMD instructions might include different instructions that execute to implement different types of Boolean logic operations. For example, a SIMD AND instruction might be capable of performing multiple concurrent AND operations with a single invocation (such as 8, 16, or some other number of concurrent operations, depending on how the instruction is defined for a particular microprocessor). In principle, the use of SIMD Boolean instructions might be able to speed up gate-level simulation by a factor corresponding to the number of SIMD operations that can be concurrently performed by a single instruction.

In practice, however, use of conventional SIMD Boolean instructions for gate-level simulation is often limited by the homogeneous nature of those instructions. For example, to gain the full benefit of a SIMD AND instruction that can concurrently perform, e.g., 16 8-bit AND operations in parallel, it would be necessary to identify within the gate-level netlist 16 AND gates that were capable of being evaluated at the same time. Depending on the design, it might be necessary to inspect the netlists for multiple distinct modules in order to find sufficient gates to fully utilize a particular SIMD instruction, if at all. Attempting to schedule a functionally-heterogeneous set of logic gates in a netlist onto a set of homogeneous SIMD instructions in a manner that maximally utilizes those instructions represents a computationally challenging problem.

In the discussion that follows, a technique is described for mapping multiple heterogeneous logic gates onto a single SIMD instruction for concurrent execution. Using this technique, it is possible for execution of one instance of a SIMD instruction to concurrently evaluate, for example, a NAND and a NOR gate, or other heterogeneous combinations of logic gates. By enabling concurrent execution of heterogeneous logic gates, this technique may simplify the process of identifying logic gates that can be concurrently executed and assigning them to SIMD instructions. In turn, this may enable higher utilization of SIMD execution resources and better gate-level simulation performance that may result in a computer-design tool to complete simulations more quickly and ultimately improve and potentially speed up the design process.

SIMD Instruction Techniques for Heterogeneous Logic Gate Simulation

As noted above, SIMD instruction sets may include homogeneous SIMD Boolean instructions that implement multiple concurrent Boolean operations with the execution of a single SIMD instruction. Other types of SIMD instructions, however, may form the basis for concurrent simulation of multiple heterogeneous logic gates through execution of a single SIMD instruction. In the following discussion, a SIMD shuffle instruction and associated data structures useful for heterogeneous logic gate simulation are described. An alternative technique employing a SIMD population count instruction is also disclosed. Subsequent to this discussion of basic simulation techniques, an example of a more detailed flow for generating an executable model from a netlist using such techniques will be described in the context of a concrete example.

Figure 2:
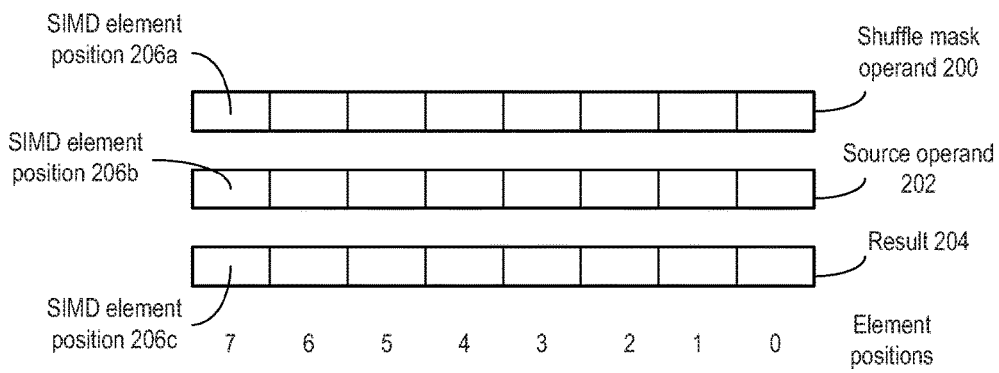
FIG. 2 illustrates the relationship between operands and result for an embodiment of a SIMD shuffle instruction.

FIG. 2 illustrates the relationship of the operands and result for an embodiment of a SIMD shuffle instruction. In the illustrated embodiment, a SIMD shuffle instruction may operate on a shuffle mask operand 200 and a source operand 202 to produce a result 204. Each of shuffle mask operand 200, source operand 202, and result 204 includes a respective set of SIMD element positions, selected ones of which are denoted 206a-c. As shown, there are 8 ordered SIMD element positions numbered from 0 to 7. Other embodiments may use any suitable number of SIMD element positions that may be ordered in a different fashion.

When executed, the SIMD shuffle instruction of FIG. 2 may map source operand 202 to result 204 as follows: for a given SIMD element position of shuffle mask operand 200 and result 204, the given SIMD element position of the shuffle mask operation contains an index that identifies a particular SIMD element position of the source operand to be output in the given SIMD element position of the result. For example, consider SIMD element position 4 of result 204. When executed, the illustrated embodiment of the SIMD shuffle instruction will examine SIMD element position 4 of shuffle mask operand 200. Based on the value contained therein, which in this example may be any of 0 to 7 (i.e., the valid values denoting individual SIMD element positions), the corresponding SIMD element position of source operand 202 will be output in SIMD element position 4 of result 204.

Conceptually, the SIMD shuffle instruction of FIG. 2 may permit the SIMD element positions of source operand 202 to be arbitrarily reordered, or "shuffled," into SIMD element positions of result 204 dependent upon a mapping indicated in the SIMD element positions of shuffle mask operand 200. In some embodiments, the individual SIMD element positions may each be one byte (i.e., 8 bits) wide, in which case the SIMD shuffle instruction may be referred to as a "byte shuffle instruction." It is noted that any instruction that is executable to rearrange elements of a SIMD operand in a selectable manner may be considered a "SIMD shuffle instruction," regardless of whether the instruction is actually denoted as such.

One example of a SIMD shuffle instruction (and, more specifically, a byte shuffle instruction) includes the VPSHUFB instruction that is defined by the Intel™ AVX instruction set architecture, and in instruction sets compliant with AVX. (The PSHUFB instruction, in which the source and destination specify the same register, may also be employed.) In the case of VPSHUFB, each of shuffle mask operand 200, source operand 202, and result 204 includes 16 bytes numbered from 0 to 15. The least significant four bits of any given byte position of shuffle mask operand 200 may contain the index value that maps a corresponding byte of source operand 202 to a byte position of result 204. (Additionally, if the most significant bit of a SIMD element position of shuffle mask operand 200 is set, then the corresponding element of result 204 is zeroed—a property that is not essential to shuffle instructions generally, but if present, may be employed in the techniques discussed below.) Other examples of SIMD shuffle instructions may include the ARM NEON VTBL and VTBX instructions.

Figure 3:
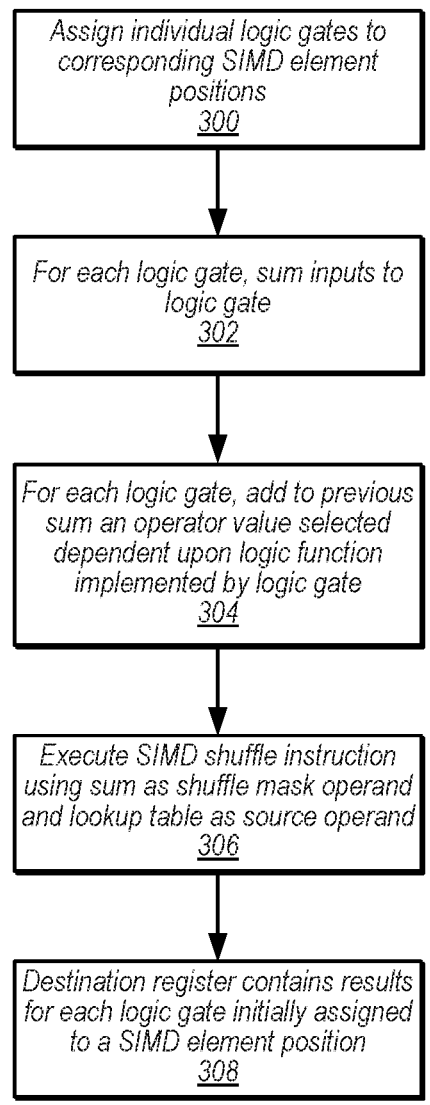
FIG. 3 is a flow diagram illustrating an embodiment of a method of employing a SIMD shuffle instruction to concurrently simulate multiple logic gates that specify different logic functions.

FIG. 3 illustrates an embodiment of a method of employing a SIMD shuffle instruction to concurrently simulate multiple logic gates, where two or more of the logic gates specify different logic functions. In block 300, individual logic gates are assigned to corresponding SIMD element positions. For example, in the case of the VPSHUFB instruction, up to 16 logic gates may be respectively assigned to byte positions 0 through 15.

In block 302, for each logic gate, the inputs to the logic gate are summed. For example, the integers 1 and 0 may be employed to represent true and false input values, respectively. In some embodiments, the state of the first input to each logic gate may be stored in the SIMD element positions of a first register, the state of the second input (if any) may be stored in the SIMD element positions of a second register, and so on. SIMD addition instructions may then be employed to concurrently sum the inputs to a set of logic gates.

In block 304, for each logic gate, an operator value is added to the previous sum, where the operator value is selected dependent upon the logic function implemented by the logic gate. Selection of the operator value is described in greater detail below.

In block 306, the SIMD shuffle instruction is executed, where the sum resulting from block 304 is specified as the shuffle mask operand, and where a lookup table is specified as the source operand. Definition of the lookup table is discussed below.

In block 308, subsequent to execution of the SIMD shuffle instruction, the destination register of the instruction contains the results for each of the individual logic gates that were initially assigned to corresponding SIMD element positions. For example, in the case of VPSHUFB, each byte of the destination register for which input values were defined may contain the result of simulating a corresponding logic gate with those input values, thus producing up to 16 results when a 128-bit register size is employed.

Generally speaking, definitions of the operator value and the lookup table discussed above may vary in different embodiments according to factors such as: the number of logic states being modelled, the size of the SIMD registers available for use, the number of distinct types of logic gates to be supported, and possibly other factors. One example of a set of operator values and a corresponding lookup table is presented in Tables 1 and 2. In the illustrated embodiment, both tables are defined under the assumptions that 2-state modeling will be performed (i.e., the only valid logic states to be represented in the model are "true" and "false," which here are assumed to correspond to the integers 1 and 0, respectively) and that the maximum number of inputs to any individual logic gate is 2.

TABLE 1

Operator Values for 2-state, 2-input Logic Functions

| Logic function | Operator value |
| --- | --- |
| NOR/NOT | 0 |
| AND | 1 |
| OR/BUF | 2 |
| NAND | 3 |
| XNOR | 4 |
| XOR | 5 |

TABLE 2

Shuffle Source Lookup Table for 2-state, 2-input Logic Functions

| Function Lookup Table | Byte Index | Value |
| --- | --- | --- |
| NOR/NOT | 0 | 1 |
| AND | 1 | 0 |
| OR/BUF | 2 | 0 |
| NAND | 3 | 1 |
| XNOR | 4 | 1 |
| XOR | 5 | 0 |
|  | 6 | 1 |
|  | 7 | 0 |
|  | 8 | 0 |
|  | 9 | 0 |
|  | 10 | 0 |
|  | 11 | 0 |
|  | 12 | 0 |
|  | 13 | 0 |
|  | 14 | 0 |
|  | 15 | 0 |

As described above with respect to FIG. 3, the operator value of Table 1 represents a particular value added to the sum of the input values of a logic gate to specify the logic function being performed by that gate. In Table 1, the single-input functions NOT (logical inversion) and BUF (buffer; passes the input value unchanged) are combined with the 2-input functions NOR and OR, respectively; in the case of the single-input functions, the second input expected by NOR/OR is set equal to 0.

Generally speaking, the shuffle source lookup table illustrated in Table 2 contains a lookup table for each defined logic function that maps the number of logically true inputs of a gate to that gate's output. (In this example, the lookup table is expressed as a vector of 16 bytes, where the byte at a given index denoted in the second column takes the value shown in the third column of Table 2.) The tables for the various logic functions are overlapped in order to save space. In the illustrated embodiment, when the sum of the inputs of a particular logic gate is added to the operator value corresponding to that logic gate, the resulting index value selects the output value for the gate in Table 2. Consider, for example, the case of the AND function, which is logically true only when both gate inputs are true. There are three possible scenarios for the sum of the gate inputs: 0, 1, or 2 of the inputs are true. When added to the operator value of 1 that corresponds to the AND function as defined in Table 1, the resultant possible indices into Table 2 are 1, 2, or 3, for which Table 2 specifies output values of 0, 0, and 1. That is, Table 2 outputs 1 for the AND function only when the sum of the inputs is 2, reflecting a true state on both gate inputs.

Tables 3 and 4 present possible definitions of the operator value and the lookup table for the case of 4-state simulation of 2-input logic functions. Generally speaking, a 4-state simulator may support the states X (undefined/unknown) and Z (high impedance) in addition to the logically true and false states for any input or output. The Z state may be used to represent a node in a circuit that is in a high impedance state that is controlled, but is neither logically true nor false (e.g., in the case of a tristate output being disabled). In some embodiments of 4-state simulation, the Z state may not actually be employed despite being supported.

In simulation, the X state may be particularly useful in detecting the propagation of uninitialized data through a logic circuit, which could lead to random behavior in a physical circuit. For example, in a 4-state simulation of a logic circuit, all state values may be initialized to the X state; if the simulated circuit allows the X state to be propagated to an output where a known result was expected, this may reveal an error in the circuit design that could manifest as erroneous behavior in the resultant physical circuit.

TABLE 3

Operator Values for 4-state, 2-input Logic Functions

| Logic function | Operator value |
| --- | --- |
| NAND | 0 |
| NOR/NOT | 1 |
| AND | 2 |
| XOR | 3 |

TABLE 4

Shuffle Source Lookup Table for 4-state, 2-input Logic Functions

| Function Lookup Table | Byte Index | Value |
| --- | --- | --- |
| NAND | 0 | 1 |
| NOR/NOT | 1 | 1 |
| AND | 2 | 0 |
| XOR | 3 | 0 |
|  | 4 | 1 |
|  | 5 | 0 |
|  | 6 | 1 |
|  | 7 | 6 |
|  | 8 | 0 |
|  | 9 | 6 |
|  | 10 | 6 |
|  | 11 | 6 |
|  | 12 | 6 |
|  | 13 | 6 |
|  | 14 | 6 |
|  | 15 | 6 |

The general usage of Tables 3 and 4 in the context of FIG. 3 may be similar to that of Tables 1 and 2. It is noted that Table 3 defines only four logic functions relative to the six defined in Table 1. Generally speaking, if the number and size of SIMD elements remains constant, increasing the number of distinct logic states from 2 to 4 will limit the number of logic functions that can be modeled using the same set of SIMD resources. Here, the XNOR and OR/BUF logic functions were omitted from Table 1 to derive Table 3, although other pairs of functions could be omitted. Moreover, it is noted that if the number and/or size of SIMD elements were increased over the 16-byte case discussed here, it may be possible to implement all of the 2-state logic functions of Table 1 in the 4-state context of Table 3.

In the illustrated version of Table 4, the value 6 was chosen to represent the X state. The value 6 may have desirable properties when considering cases at either numerical extreme of the range of sums that may result from adding input values and the operator value. For example, considering the case of an operator value of 0 (a NAND operation, in this example) with one false (0) input and one X (6) input, the sum of the inputs and the operator value is 6. The sixth byte in the lookup table is the byte after the last 2-state lookup table in Table 2 (in this case, XOR). This configuration allows NAND(0, X) to have a distinct value from XOR(1, 1), without leaving any element positions in the source operand of the shuffle instruction unused.

Considering the logic function having the maximum operator value (3, representing XOR in this case) and two X (6) inputs, the sum of the inputs and the operator value would be 15, which is less than or equal to the index of the last element position in the source operand. Using the value 6 for X enables XOR(X, X) to have a distinct value from NAND(0, 0). If the sum of the XOR(X, X) case were greater than the index of the last SIMD element position of the source operand, the sum would wrap around, and logic functions having higher operator values applied to two X inputs would share output values with logic functions having lower operator values applied to two false (0) inputs.

It is emphasized that the configurations just described for the operator value and the lookup table employed for the shuffle instruction source operand are merely examples. Numerous alternative configurations that employ different combinations and definitions of logic functions as well as different state definitions in the 2-state and 4-state contexts are possible and contemplated, and the foregoing examples are in no way to be construed as limiting.

As noted previously, in some embodiments, a SIMD population count instruction may be employed instead of a SIMD shuffle instruction to perform heterogeneous logic gate simulation. Generally speaking, a SIMD population count instruction may operate to count the number of bits in each SIMD element that are logically true (e.g., equal to 1). The instruction sets of certain general-purpose processors and graphics processors (e.g., those supporting the NVIDIA™ CUDA™ API and associated PTX instruction set) support SIMD population count instructions suitable for use with the techniques described below.

Figure 4:
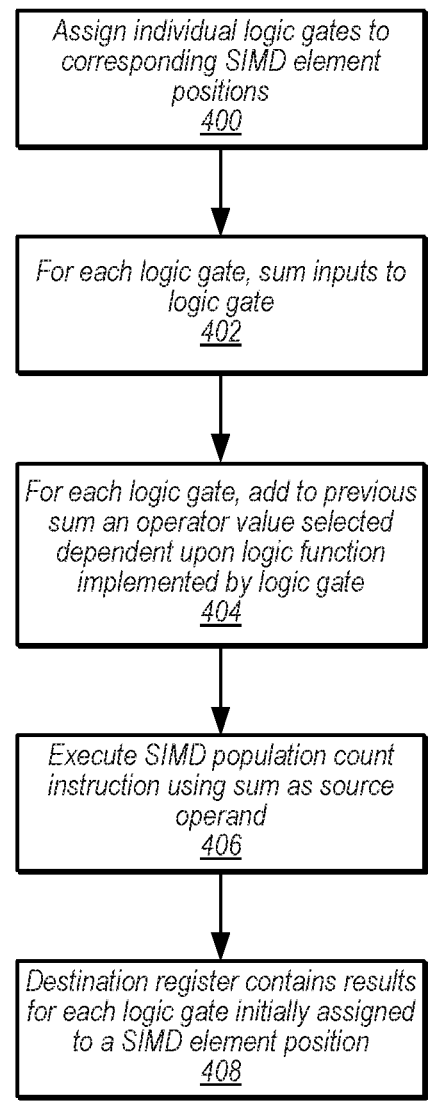
FIG. 4 is a flow diagram illustrating an embodiment of a method of employing a SIMD population count instruction to concurrently simulate multiple logic gates that specify different logic functions.

FIG. 4 illustrates an embodiment of a method of employing a SIMD population count instruction to concurrently simulate multiple logic gates, where two or more of the logic gates specify different logic functions. In block 400, individual logic gates are assigned to corresponding SIMD element positions.

In block 402, for each logic gate, the inputs to the logic gate are summed. For example, as noted above with respect to FIG. 3, the integers 1 and 0 may be employed to represent true and false input values, respectively. SIMD techniques may be employed as discussed above with respect to block 302 of FIG. 3 to sum the inputs to a set of logic gates in parallel.

In block 404, for each logic gate, an operator value is added to the previous sum, where the operator value is selected dependent upon the logic function implemented by the logic gate. Selection of the operator value in the context of the population count implementation is described in greater detail below.

In block 406, the SIMD population count instruction is executed, where the sum resulting from block 404 is specified as the operand. Definition of the lookup table is discussed below. Unlike the case of the SIMD shuffle instruction, only a single operand may be required for a population count instruction.

In block 408, subsequent to execution of the SIMD population count instruction, the destination register of the instruction contains the results for each of the individual logic gates that were initially assigned to corresponding SIMD element positions.

Table 5 illustrates an example definition of a set of operator values that may be employed in conjunction with the method of FIG. 4. In particular, Table 5 represents a set of operator values corresponding to a 2-state model of 2-input logic gates. However, as noted previously, other sets of values may be used to employ the same or a different set of logic functions according to different design requirements.

TABLE 5

Operator Values for 2-state, 2-input Logic Functions

| Logic function | Operator value |
| --- | --- |
| OR/BUF | 0 |
| NAND | 1 |
| XNOR | 2 |
| XOR | 3 |
| NOR/NOT | 4 |
| AND | 5 |

Generation of Executable Model from Netlist

Figure 5:
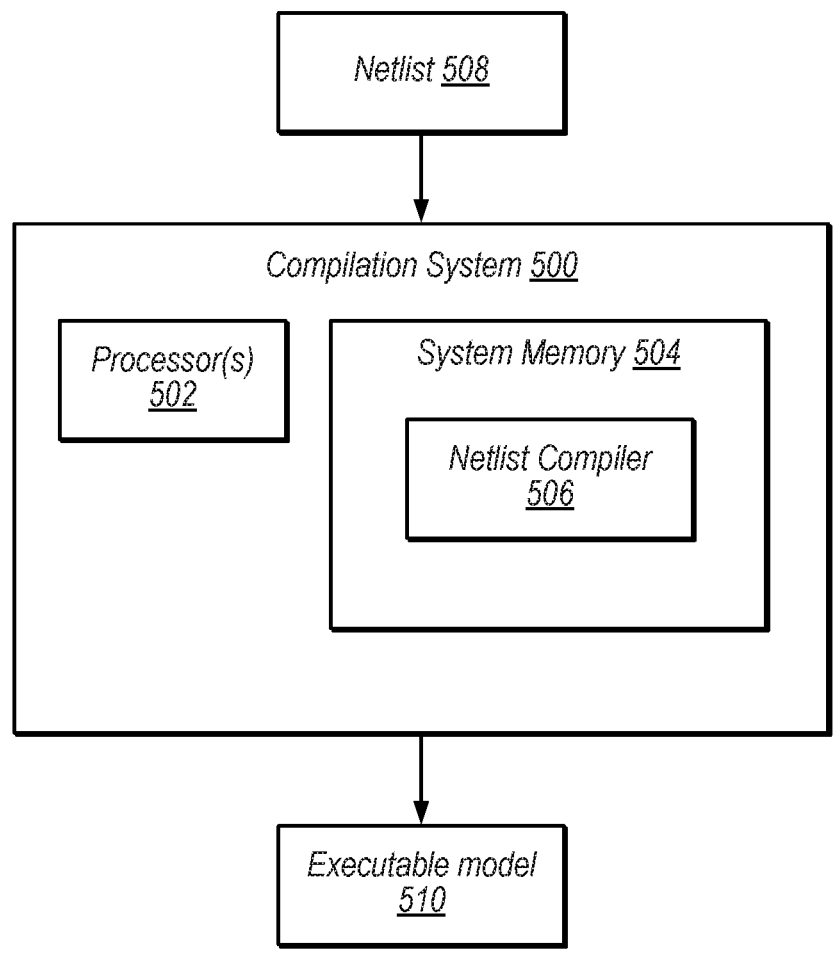
FIG. 5 illustrates an embodiment of a design process that may be employed in the generation of executable netlist simulation models.

FIG. 5 illustrates an embodiment of a design process or flow through which the techniques discussed above may be employed in the generation of executable netlist simulation models. Compilation system 500 may include one or more processors 502 and a system memory 504. Netlist compiler 506, in some embodiments, may be implemented as a set of program instructions executable by processor(s) 502 to perform various operations. For example, as described in greater detail below, netlist compiler 506 may be executable to receive (e.g., from a storage device internal or external to compilation system 500) a netlist 508 that specifies a gate-level representation of a digital circuit, and may further be executable to generate an executable model 510 that is itself executable to simulate the behavior of the circuit defined by netlist 508. Executable model 510 may then be executed on one or more computer systems (that may be similar to or distinct from compilation system 500) to simulate the behavior of netlist 508 in response to various inputs.

Figure 6:
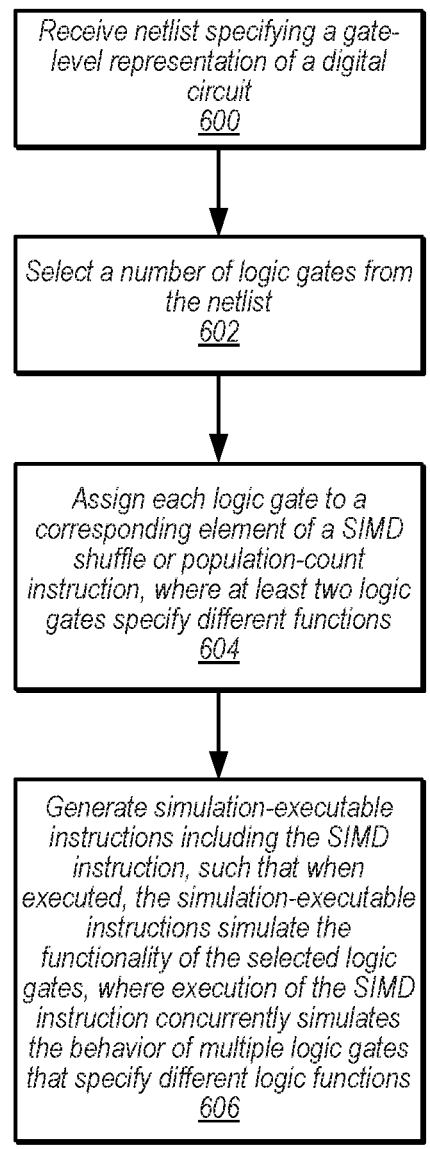
FIG. 6 is a flow diagram that illustrates an embodiment of a method of operation of a netlist compiler.

The flow diagram of FIG. 6 illustrates, at a high level of generality, an embodiment of a method of operation of netlist compiler 506. Operation begins in block 600, where a netlist that specifies a gate-level representation of a digital circuit is received. For example, such a netlist may be generated by a synthesis tool, schematic capture, or via other techniques or combinations thereof and stored in one or more files that may be read by netlist compiler 506. The netlist may be representative of an entire digital circuit design or any suitable portion. In some embodiments, the netlist may also contain logic that is not part of the digital circuit itself, but may be included to facilitate simulation. For example, the netlist may include test stimulus generators, bus transactors, or other types of modules.

In block 602, a number of logic gates are selected from the netlist. For example, as discussed in greater detail below, logic gates may be selected according to their connectivity, such that upstream gates (gates closer to the inputs of the digital circuit) are selected prior to downstream gates (gates closer to the outputs of the digital circuit). In some embodiments, the logic gates may be selected dependent upon a number of storage locations within a bounded region of storage locations (such as, e.g., the SIMD register file, or a combination of register files such as the AVX and MMX register files taken together), such that after the bounded region of storage locations is populated with initial simulation values, the selected logic gates may be simulated without accessing storage external to that bounded region (e.g., storage external to the SIMD register file). For example, in selecting logic gates for further processing, netlist compiler 506 may attempt to select enough gates to maximally utilize SIMD register file resources, while at the same time ensuring that once simulation of the selected gates begins, those gates can be simulated entirely within the SIMD register file without requiring access to data not already resident within the SIMD register file.

In block 604, each of the selected number of logic gates is assigned to a corresponding element position of a SIMD instruction, where at least two of the logic gates specify different logic functions, and where the SIMD instruction includes a shuffle instruction or a population count instruction. In some embodiments, the shuffle instruction may be a byte shuffle instruction such as the VPSHUFB instruction discussed above, where each of 16 byte positions corresponding to respective SIMD element positions may be assigned a corresponding logic gate.

In block 606, simulation-executable instructions including the SIMD instruction are generated, such that when executed, the simulation-executable instructions simulate the functionality of the selected logic gates, and where execution of the SIMD instruction concurrently simulates the behavior of multiple logic gates that specify different logic functions. For example, the simulation-executable instruction may form part or all of executable model 510.

In some embodiments, generating the simulation-executable instructions may include generating instructions that are preliminary to the execution of the SIMD instruction that generates simulated values of logic gate operation. For example, generating the instructions for executable model 510 for a particular subset of logic gates may include outputting simulation-executable instruction(s) to store first inputs of the particular subset of logic gates in corresponding element positions of a first SIMD register, and second inputs of the particular subset of logic gates in corresponding element positions of a second SIMD register. (That is, for a logic gate corresponding to an element position numbered N, position N of the first and second SIMD registers may contain the values of the first and second inputs to the logic gate.) It is noted that for commutative Boolean operations, however, there may be no necessary correspondence between the input position of a logic gate and the particular SIMD register that stores a value for that input position. That is, a given input position of a logic gate may be associated to a corresponding SIMD element position of either the first or second SIMD register, and the same input position of a different logic gate may be mapped to a different register.

Further, in some embodiments, generating the instructions for executable model 510 may include outputting simulation-executable instruction(s) to generate a sum of the respective element positions of the first SIMD register and the second SIMD register along with an operator value for each element position. The operator value at a given element position may be selected dependent upon a logic function implemented by a logic gate that is associated with the given element position. Thus, for example, an operator value appropriately selected from one of Tables 1, 3, or 5 (or according to another suitable definition) may be added to each element position according to the particular type of logic gate assigned to that position.

Additionally, in some embodiments, generating the instructions for executable model 510 may include outputting a shuffle instruction (e.g., the VPSHUFB byte shuffle instruction, or a different instruction) where the sum referenced in the previous paragraph is specified as a shuffle mask operand, and where a lookup table is specified as a source operand. The values in the lookup table may be selected dependent upon a simulation mode, such as either a 2-state simulation or a 4-state simulation. For example, lookup tables such as those specified in Tables 2 or 4, or another suitable definition, may be employed. In other embodiments, a population count instruction may be generated having the sum referenced above as its source operand.

Additional Compiler Operations and Example Netlist

In some embodiments, netlist compiler 506 may be configured to perform additional operations related to the generation of executable model 510. Some examples of such operations are discussed below in the context of the compilation of the example circuit shown in FIG. 7, which may also be referred to as a logic block. The illustrated circuit receives five inputs, denoted A through E, and generates two outputs, denoted Q0 and Q1, via four logic gates. For purposes of the present discussion, 2-state simulation will be assumed. (It is noted that the illustrated example is deliberately simplified to facilitate discussion, and that the operations described here may be generalized to apply to arbitrarily complex designs.) The operations discussed below are also illustrated in the flow chart of FIG. 8, it being noted that in various embodiments, some or all of the illustrated operations may be omitted or reordered where it is desired and feasible to do so.

Figure 7:
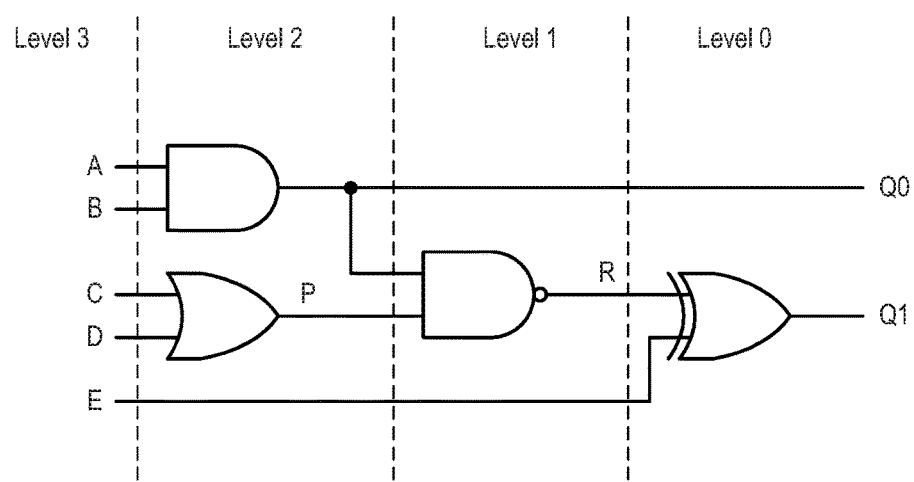
FIG. 7 illustrates an example of a digital circuit.

Initially, netlist compiler 506 may determine a memory allocation for the input and output values for a logic block (block 800). In some embodiments, netlist compiler 506 may attempt to allocate logic block outputs to contiguous locations in memory that are aligned on a boundary such that the outputs can be written from registers to memory using a minimal number of wide move instructions (e.g., 16-byte move instructions). Because outputs of some logic blocks often form inputs to other blocks, this allocation scheme may result in a sparse distribution of block inputs in memory. An example memory allocation for the logic block of FIG. 7 is given in Table 6. Here, the memory address allocated for logic block input/output begins at a relative offset of 16; addresses 0-15 may be reserved for other simulation purposes. However, any suitable allocation scheme may be employed. The allocation in Table 6 may be padded to a multiple of 16 bytes; i.e., not all memory locations may be employed. Moreover, internal nodes of the logic block (e.g., nodes P and R in FIG. 7) need not be allocated in memory, provided that there are sufficient register resources to store the simulation values of the internal nodes. Further, while the allocation shown here assigns one value per byte, it is contemplated that in some embodiments, memory allocation may be performed such that values are packed more densely. For example, one value may be assigned for each bit in a byte, so that the allocation may be eight times as dense as that shown here, although other allocation densities may also be employed.

TABLE 6

| Example Runtime Memory Allocation | | | | | | | | |
|---|---|---|---|---|---|---|---|---|
| Addr | 16 | 17 | 18 | 19 | 20 | 21 | 22 | ... | 31 |
| Value | A | B | C | D | E | Q0 | Q1 | 0 | 0 |

Netlist compiler 506 may be configured to sort the netlist into ordered levels, where each logic gate in a given ordered level has inputs drawn only from a previous ordered level (i.e., one or more "upstream" levels), such that logic gates in a given level can be evaluated concurrently (block 802). This may also be referred to as a "topological sort." FIG. 7 illustrates an example of the four ordered levels that may be determined for the illustrated logic block, denoted Level 0 through Level 3.

Once the levels have been determined, netlist compiler 506 may be configured to perform a liveness analysis on the signals within the logic block (block 804). Generally speaking, liveness analysis identifies the level at which each signal is first generated (denoted the "start level") and the level at which the signal is last consumed as an input (denoted the "end level"). Liveness analysis may facilitate allocation of register resources to the various signals in a set of logic gates to be simulated; in general, it is not necessary to allocate storage to a signal before computing the level in which it is generated or after computing the last level in which it is used. An example liveness analysis for the logic block of FIG. 7 is shown in Table 7.

TABLE 7

| Liveness Analysis for Example Circuit | | |
|---|---|---|
| Signal | Start level | End level |
| A | 3 | 2 |
| B | 3 | 2 |
| C | 3 | 2 |
| D | 3 | 2 |

TABLE 7-continued

Liveness Analysis for
Example Circuit

| Signal | Start level | End level |
|---|---|---|
| E | 3 | 0 |
| P | 2 | 1 |
| R | 1 | 0 |
| Q0 | 2 | 0 |
| Q1 | 0 | 0 |

In some embodiments, netlist compiler 506 may be configured to assign signals associated with the logic gates of the logic block to corresponding register locations dependent upon the liveness analysis (block 806). The register locations may correspond to individual bytes of registers of a SIMD register file, or to SIMD element locations other than a byte in size. Based on the liveness analysis, multiple signals of the logic block may be assigned to the same register location, so long as the range of start and end levels of the signals do not overlap.

In the following discussion, a hypothetical SIMD register file will be assumed. This SIMD register file includes 16 registers (denoted reg0 through reg15), each including 16 individual SIMD element positions (denoted regN[0] through regN[15] for a particular value of N). Further, it will be assumed that registers reg4 through reg15 are employed as temporary storage of intermediate signal values, while registers reg0 through reg3 are employed as working registers used for the computation of simulation results. In this approach, it is noted that individual SIMD elements of particular SIMD registers, rather than entire SIMD registers, may be allocated to individual signals. It is further noted, however, that these assumptions are made merely to facilitate explanation, and that other register file organizations and allocation schemes are possible and contemplated.

One example of how netlist compiler 506 may perform register allocation is as follows. First, netlist compiler 506 may assign logic block outputs to register locations in the order the outputs appear in the memory allocation. In some implementations, netlist compiler 506 may extend the persistence of some outputs until a total of 16 outputs are live (or however many register locations can be concurrently stored with a single move instruction) in order to efficiently utilize memory bandwidth when writing outputs to memory. In some instances, there may be fewer than 16 outputs to be written, in which case some element positions of the SIMD move instruction may be ignored. In this particular example, outputs Q0 and Q1 may be assigned to reg4[0] and reg4[1] respectively (i.e., to the first register locations in the first temporary storage register, under the assumptions stated above).

Following assignment of register locations to output signals, netlist compiler 506 may assign register locations to remaining signals. In an embodiment, netlist compiler 506 may maintain a stack of available register locations (e.g., individual byte locations within register files), and may loop through all circuit layers from the input level (level N, where N depends on the number of levels in the circuit) to the output level (level 0). For each new signal introduced in a given level, netlist compiler 506 may pop a register location off of a stack data structure and assign it to the new signal. For each signal that is no longer needed after the given level (e.g., as indicated by the liveness analysis), netlist compiler 506 may push the corresponding register location for that signal onto the stack data structure. FIG. 9 illustrates example pseudocode for this stack-based allocation algorithm, although other approaches are possible and contemplated.

Table 8 illustrates an example register allocation for the signals shown in FIG. 7. It can be seen in this example that register location reg4[5] is used for signal A and reused for signal R, because the liveness analysis indicates that the levels utilized by these signals do not overlap. Simpler register allocation procedures that do not attempt to perform liveness analysis and register reuse are possible, though they may not utilize register resources as efficiently.

TABLE 8

Example Register
Allocation

| Signal location | Register |
|---|---|
| A | reg4[5] |
| B | reg4[4] |
| C | reg4[3] |
| D | reg4[1] |
| E | reg4[2] |
| P | reg4[6] |
| R | reg4[5] |
| Q0 | reg4[0] |
| Q1 | reg4[1] |

Subsequent to register allocation, netlist compiler 506 may generate native code for execution on the targeted simulation platform (block 808). For example, using register allocation and topological sort information, netlist compiler 506 may emit executable instructions according to any suitable instruction set architecture (ISA). The resultant instructions may correspond to executable model 510.

Collectively, FIGS. 10A-F illustrate an example of native code generation corresponding to the example circuit of FIG. 7 employing the various examples of liveness and register allocation presented above. The illustrated code listing is presented as pseudocode that does not necessarily correspond to any particular ISA, but could easily be mapped to a desired ISA. For example, a generic "shuffle" instruction is referenced that, in an actual implementation, could be substituted with the VPSHUFB instruction discussed above, or another suitable implementation of a shuffle instruction. Although the illustrated code uses a shuffle instruction, it may be readily modified to employ a population count instruction instead.

Figure 11:
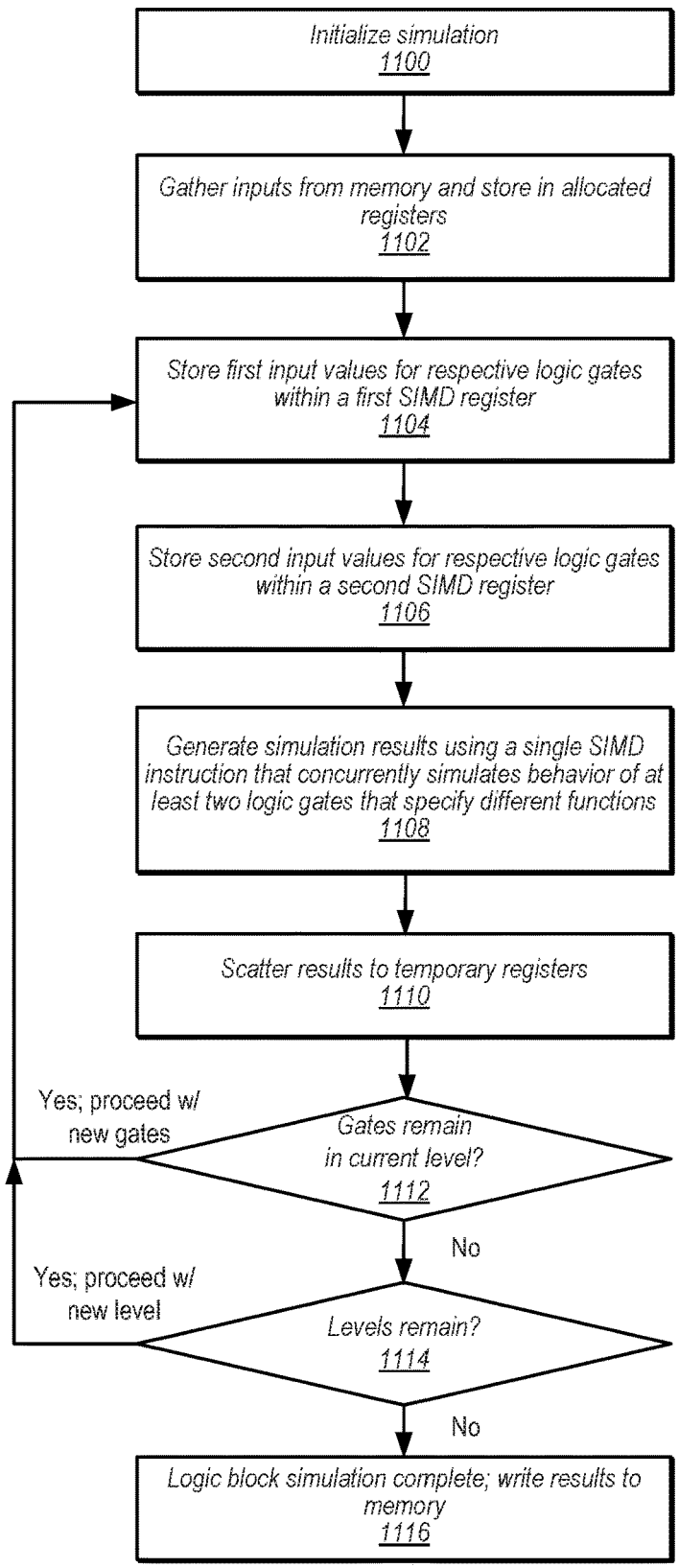
FIG. 11 is a flow chart illustrating an embodiment of execution of a simulation model.

The pseudocode shown in FIGS. 10A-F is extensively commented at the level of individual operations. The flow chart of FIG. 11 illustrates in general terms how execution of a simulation model patterned after the illustrated code might proceed in some embodiments. Operation begins at block 1100 where simulation initialization occurs. For example, initialization may include storing within a particular register the lookup table that will be utilized by the shuffle instruction to evaluate logic gates.

In block 1102, inputs are gathered from memory and stored in the locations specified by the register allocation process. In some embodiments, the shuffle instruction may be employed to permute the input values as stored in memory to the positions defined by the register allocation. However, any suitable technique for reordering or mapping data may be employed.

In block 1104, first input values for respective logic gates are stored within corresponding SIMD element positions of a first SIMD register. For example, each element position of the first SIMD register may correspond to a respective logic gate of a set of logic gates to be simulated, at least two of which specify different logic functions. Moreover, the first input value at a given SIMD element position may correspond to a first input of the respective logic gate corresponding to the given SIMD element position.

In block 1106, second input values for respective logic gates are stored within corresponding SIMD element positions of a second SIMD register. The second input value at a given SIMD element position may correspond to a second input of the respective logic gate corresponding to the given SIMD element position.

It is noted that in some embodiments, the first and second SIMD registers may be working registers that are loaded from other SIMD registers that temporarily store simulation values. For example, a shuffle instruction may be used to move needed input values from a temporary SIMD into a working SIMD register for computation. However, it is noted that other techniques for moving data between temporary and working SIMD registers may be employed. Moreover, in some embodiments, other types of storage may be employed instead of temporary SIMD registers, such as memory locations or other register files (e.g., general purpose or floating point register files).

In block 1108, simulation results indicative of the functionality of the set of logic gates are generated using a single SIMD instruction, where execution of the single SIMD instruction concurrently simulates the behavior of at least two logic gates that specify different functions. As noted above, in some embodiments, the first and second SIMD registers may be summed along with an operator value for each SIMD element position that is selected dependent upon the logic function implemented by the logic gate corresponding to that SIMD element position. In various embodiments, as discussed above, the single SIMD instruction may be a shuffle instruction or a population count instruction.

In block 1110, the simulation results may be scattered back to temporary registers. For example, a shuffle instruction may be used to move the results from a working register back to a temporary register in a manner complementary to the gathering of operand values discussed above with respect to blocks 1004-06.

At block 1112, if more logic gates remain to be simulated within the current level of logic (as determined, e.g., by the topological sort during netlist compilation), then operation may proceed from block 1104 with a different set of gates in the current level to be simulated. Otherwise, at block 1114, it is determined whether the current level of logic is the last level to be computed. If not, operation may proceed from block 1104 with a set of gates in the next level of logic. If so, at block 1116, simulation of the logic block is complete, and the results are written back to memory.

It is noted that in some embodiments, the logic circuit to be simulated may be a complex circuit with a number of different logic blocks. Correspondingly, in some embodiments, netlist compiler 506 may incorporate other features within simulation model 510 in order to correctly manage the simulation of a complex circuit. For example, simulation model 510 may include a dependency graph that may be employed by an event-driven scheduling framework. The event-driven scheduling framework may employ the dependency graph to attempt to determine what components are affected by changes to the outputs of a given component. Thus, for example, when the given component is simulated, simulation model 510 may attempt to schedule for execution only those components having outputs that might be affected by the given component, so that components that are unaffected are not needlessly executed. It is noted, however, that any suitable technique for managing the simulation of complex, multi-component designs may be employed, including cycle-driven methods that may unconditionally evaluate all logic gates during every cycle of circuit operation regardless of whether their inputs have changed state.

Example Computing System

As described above, for example with respect to compilation system 500 of FIG. 5, various operations described herein may be implemented by a computing device configured to execute program instructions that specify the operations. Similarly, various operations may be performed by circuitry designed or configured to perform the operations. In some embodiments, a non-transitory computer-readable medium has program instructions stored thereon that are capable of causing various operations described herein. As used herein, the term "processor," "processing unit," or "processing element" refers to various elements or combinations of elements configured to execute program instructions. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Figure 12:
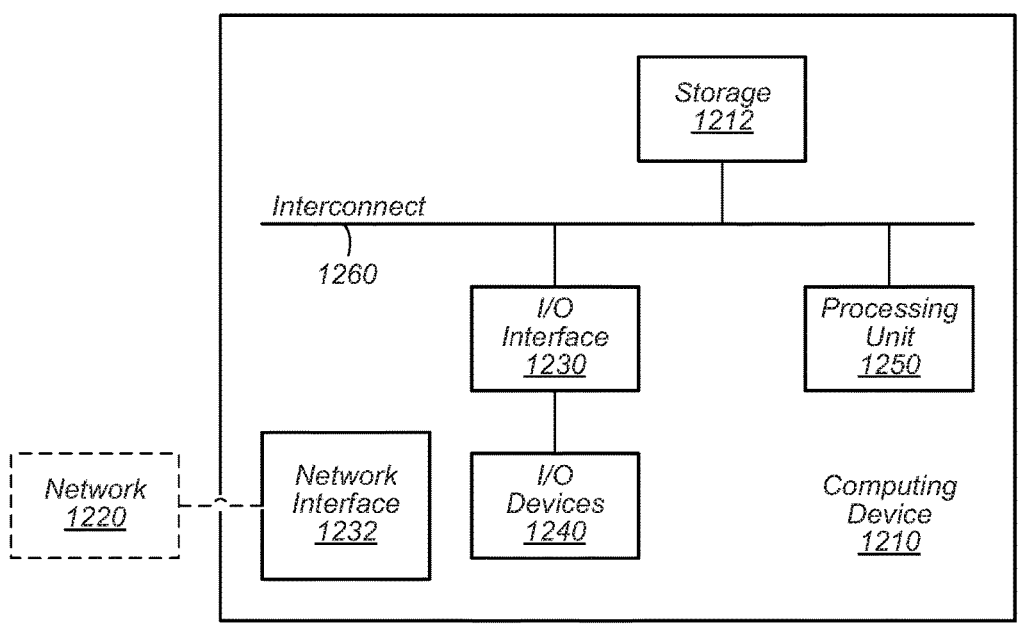
FIG. 12 is a block diagram illustrating an embodiment of a computing device or system.

Turning now to FIG. 12, a block diagram of a computing device (which may also be referred to as a computing system) 1210 is depicted, according to some embodiments. Computing device 1210 may be used to implement various portions of this disclosure. For example, computing device 1210 may be used to implement compilation system 500 and/or a system on which executable model 510 is executed in order to simulate netlist 508. Computing device 1210 is one example of a device that may be used as a mobile device, a server computing system, a client computing system, or any other computing system implementing portions of this disclosure.

Computing device 1210 may be any suitable type of device, including, but not limited to, a personal computer system, desktop computer, laptop or notebook computer, mobile phone, mainframe computer system, server, web server, workstation, or network computer. As shown, computing device 1210 includes processing unit 1250, storage subsystem 1212, and input/output (I/O) interface 1230 coupled via interconnect 1260 (e.g., a system bus). I/O interface 1230 may be coupled to one or more I/O devices 1240. Computing device 1210 further includes network interface 1232, which may be coupled to network 1220 for communications with, for example, other computing devices.

As described above, processing unit 1250 includes one or more processors. In some embodiments, processing unit 1250 includes one or more coprocessor units. In some embodiments, multiple instances of processing unit 1250 may be coupled to interconnect 1260. Processing unit 1250 (or each processor within processing unit 1250) may contain a cache or other form of on-board memory. In some embodiments, processing unit 1250 may be implemented as a general-purpose processing unit, and in other embodiments it may be implemented as a special purpose processing unit (e.g., an ASIC). In general, computing device 1210 is not limited to any particular type of processing unit or processor subsystem.

As used herein, the terms "processor," "processing unit," or "processing element" refer to circuitry configured to perform operations or to a memory having program instructions stored therein that are executable by one or more processors to perform operations. Accordingly, a processing unit may be implemented as a hardware circuit implemented in a variety of ways. The hardware circuit may include, for example, custom very-large-scale integration (VLSI) circuits or gate arrays, off-the-shelf semiconductors such as logic chips, transistors, or other discrete components. A processing unit may also be implemented in programmable hardware devices such as field programmable gate arrays, programmable array logic, programmable logic devices, or the like. A processing unit may also be configured to execute program instructions or computer instructions from any suitable form of non-transitory computer-readable media to perform specified operations.

Storage subsystem 1212 is usable by processing unit 1250 (e.g., to store instructions executable by and data used by processing unit 1250). Storage subsystem 1212 may be implemented by any suitable type of physical memory media, including hard disk storage, floppy disk storage, removable disk storage, flash memory, random access memory (RAM-SRAM, EDO RAM, SDRAM, DDR SDRAM, RDRAM, etc.), ROM (PROM, EEPROM, etc.), and so on. Storage subsystem 1212 may consist solely of volatile memory in some embodiments. Storage subsystem 1212 may store program instructions executable by computing device 1210 using processing unit 1250, including program instructions executable to cause computing device 1210 to implement the various techniques disclosed herein. Storage subsystem 1212, in its various embodiments not limited to those examples provided here, may be considered to be an example of a non-transitory computer-readable or computer-accessible medium.

I/O interface 1230 may represent one or more interfaces and may be any of various types of interfaces configured to couple to and communicate with other devices, according to various embodiments. In some embodiments, I/O interface 1230 is a bridge chip from a front-side to one or more back-side buses. I/O interface 1230 may be coupled to one or more I/O devices 1240 via one or more corresponding buses or other interfaces. Examples of I/O devices include storage devices (hard disk, optical drive, removable flash drive, storage array, SAN, or an associated controller), network interface devices, user interface devices or other devices (e.g., graphics, sound, etc.). In some embodiments, the geophysical data product discussed above may be embodied within one or more of I/O devices 1240.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A non-transitory computer-readable storage medium that stores program instructions, wherein the program instructions are executable by one or more processors to:
   select, from a netlist that specifies a gate-level representation of a digital circuit, a plurality of logic gates;
   assign each of the plurality of logic gates to a corresponding element position of a single instance of a single-instruction, multiple-data (SIMD) instruction, wherein at least two of the plurality of logic gates specify different logic functions, and wherein the single instance of the SIMD instruction includes a byte shuffle instruction or a population count instruction; and
   generate simulation-executable instructions including the single instance of the SIMD instruction, wherein when executed, the simulation-executable instructions simulate the functionality of the plurality of logic gates, and wherein execution of the single instance of the SIMD instruction concurrently simulates operation of the at least two of the plurality of logic gates that specify different logic functions.

2. The non-transitory computer-readable storage medium of claim 1, wherein:
   the byte shuffle instruction, when executed, operates on a shuffle mask operand and a source operand to produce a result;
   each of the shuffle mask operand, the source operand, and the result includes a respective plurality of bytes occupying ordered positions; and
   for a given byte position of the shuffle mask operand and the result, the given byte position of the shuffle mask operand contains an index that identifies a particular byte position of the source operand to be output in the given byte position of the result.

3. The non-transitory computer-readable storage medium of claim 2, wherein each of the shuffle mask operand, the source operand, and the result includes 16 bytes, and wherein the index includes a least significant four bits of the given byte position of the shuffle mask operand.

4. The non-transitory computer-readable storage medium of claim 1, wherein prior to generating the simulation-executable instructions, the program instructions are further executable to:
   separate the plurality of logic gates into one or more ordered levels, such that each logic gate in a given ordered level has inputs drawn only from a previous ordered level;
   perform a liveness analysis on the plurality of logic gates in the one or more ordered levels; and
   dependent on the liveness analysis, assign signals associated with the plurality of logic gates to corresponding register locations.

5. The non-transitory computer-readable storage medium of claim 4, wherein the register locations correspond to individual byte positions of a set of SIMD operand registers of a SIMD register file.

6. The non-transitory computer-readable storage medium of claim 1, wherein the plurality of logic gates is selected dependent upon a number of available locations within a bounded region of storage locations, such that after the bounded region of storage locations is populated with initial simulation values, the simulation-executable instructions are executable to simulate the plurality of logic gates without accessing storage external to the bounded region of storage locations.

7. The non-transitory computer-readable storage medium of claim 1, wherein the program instructions are further executable to:
   assign each of a different plurality of logic gates to a corresponding element position of a different instance of the SIMD instruction, wherein at least two of the plurality of logic gates specify different logic functions; and
   generate simulation-executable instructions including the different instance of the SIMD instruction, wherein when executed, the simulation-executable instructions simulate the functionality of the different plurality of logic gates, and wherein execution of the different instance of the SIMD instruction concurrently simulates operation of the at least two of the different plurality of logic gates that specify different logic functions.

8. The non-transitory computer-readable storage medium of claim 1, wherein to generate the simulation-executable instructions for a particular subset of the plurality of logic gates, each logic gate of the particular subset having a respective first input and a respective second input, the program instructions are further executable to:
output one or more simulation-executable instructions that, when executed, store the respective first inputs of the particular subset of logic gates within corresponding element positions of a first SIMD register;
output one or more simulation-executable instructions that, when executed, store the respective second inputs of the particular subset of logic gates within corresponding element positions of a second SIMD register; and
output one or more simulation-executable instructions that, when executed, generate a sum of the respective element positions of the first SIMD register and the second SIMD register along with an operator value for each element position, wherein the operator value at a given element position is selected dependent upon a logic function implemented by a logic gate of the particular subset that is associated with the given element position.

9. The non-transitory computer-readable storage medium of claim 8, wherein to generate the simulation-executable instructions for the particular subset of logic gates, the program instructions are further executable to:
output the byte shuffle instruction, wherein the sum is specified as a shuffle mask operand of the byte shuffle instruction, and wherein a lookup table is specified as a source operand of the byte shuffle instruction.

10. The non-transitory computer-readable storage medium of claim 9, wherein values stored within the lookup table are selected dependent upon a simulation mode, wherein the simulation mode specifies either 2-state simulation or 4-state simulation.

11. The non-transitory computer-readable storage medium of claim 8, wherein to generate the simulation-executable instructions for the particular subset of logic gates, the program instructions are further executable to:
output the population count instruction, wherein the sum is specified as a source operand of the population count instruction.

12. A system, comprising:
one or more processors; and
a memory that stores program instructions, wherein the program instructions are executable by the one or more processors to:
store a plurality of first input values within corresponding single-instruction, multiple-data (SIMD) element positions of a first SIMD register;
wherein each of the SIMD element positions corresponds to a respective logic gate of a plurality of logic gates representative of a digital circuit;
wherein for each given one of the SIMD element positions, the first input value at the given SIMD element position corresponds to a first input of the respective logic gate corresponding to the given SIMD element position; and
wherein at least two of the plurality of logic gates specify different logic functions;
store a plurality of second input values within corresponding SIMD element positions of a second SIMD register, wherein for each given one of the SIMD element positions, the second input value at the given SIMD element position corresponds to a second input of the respective logic gate corresponding to the given SIMD element position; and
generate, using a single SIMD instruction that is dependent upon the first and second SIMD registers, simulation results indicative of the functionality of the plurality of logic gates, wherein execution of the single SIMD instruction concurrently simulates operation of the at least two of the plurality of logic gates that specify different functions.

13. The system of claim 12, wherein:
the single SIMD instruction is a shuffle instruction that operates on a shuffle mask operand and a source operand to produce a result;
each of the shuffle mask operand, the source operand, and the result includes a respective plurality of SIMD element positions; and
for a given SIMD element position of the shuffle mask operand and the result, the given SIMD element position of the shuffle mask operand contains an index that identifies a particular SIMD element position of the source operand to be output in the given SIMD element position of the result.

14. The system of claim 13, wherein:
prior to generating simulation results, the program instructions are further executable to generate a sum of respective SIMD element positions of the first SIMD register and the second SIMD register along with an operator value for each SIMD element position, wherein the operator value at a given SIMD element position is selected dependent upon a logic function implemented by the respective logic gate corresponding to the given SIMD element position; and
the sum is specified as the shuffle mask operand of the shuffle instruction, and a lookup table is specified as the source operand of the shuffle instruction.

15. The system of claim 14, wherein values stored within the lookup table are selected dependent upon a simulation mode, wherein the simulation mode specifies either 2-state simulation or 4-state simulation.

16. The system of claim 12, wherein:
the single SIMD instruction is a population count instruction;
prior to generating simulation results, the program instructions are further executable to generate a sum of respective SIMD element positions of the first SIMD register and the second SIMD register along with an operator value for each SIMD element position, wherein the operator value at a given SIMD element position is selected dependent upon a logic function implemented by the respective logic gate corresponding to the given SIMD element position; and
the sum is specified as a source operand of the population count instruction.

17. The system of claim 12, wherein:
the first and second SIMD registers are included within a plurality of registers of a SIMD register file;
the plurality of logic gates is included within a larger set of gates, wherein a number of gates included in the larger set exceeds a number of SIMD element positions available within a single register of the SIMD register file; and
wherein data representative of the larger set of gates is stored within remaining registers of the SIMD register file, such that generation of simulation results indicative of the functionality of the larger set of gates occurs without accessing memory external to the SIMD register file.

18. A method, comprising:

generating, by one or more processors, a set of values indicative of inputs to a plurality of logic gates representative of a digital circuit; and executing, by the one or more processors, a single instance of a single-instruction multiple-data (SIMD) instruction dependent upon the set of values to concurrently simulate the functionality of the plurality of logic gates;

wherein at least two of the plurality of logic gates specify different logic functions that are concurrently simulated by executing the single instance of the SIMD instruction.

19. The method of claim 18, wherein the single instance of the SIMD instruction is a byte shuffle instruction or a population count instruction.

20. The method of claim 18, wherein generating the set of values comprises summing, for each given one of the plurality of logic gates, input values indicative of logic states of individual inputs to the given logic gate along with an operator value, wherein the operator value is indicative of a type of logic function implemented by the given logic gate.

* * * * *